United States Patent
Park et al.

(10) Patent No.: US 10,074,481 B2
(45) Date of Patent: Sep. 11, 2018

(54) CAPACITOR COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Young Key Kim, Suwon-si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 37 days.

(21) Appl. No.: 15/064,417

(22) Filed: Mar. 8, 2016

(65) Prior Publication Data

US 2017/0076863 A1    Mar. 16, 2017

(30) Foreign Application Priority Data

Sep. 14, 2015 (KR) ........................ 10-2015-0129489

(51) Int. Cl.
| | |
|---|---|
| *H01G 4/248* | (2006.01) |
| *H01G 4/30* | (2006.01) |
| *H05K 3/34* | (2006.01) |
| *H01G 2/06* | (2006.01) |
| *H01G 4/232* | (2006.01) |

(52) U.S. Cl.
CPC .................. *H01G 4/30* (2013.01); *H01G 2/06* (2013.01); *H01G 4/232* (2013.01); *H01G 4/2325* (2013.01); *H05K 3/3442* (2013.01); *H05K 2201/0133* (2013.01); *H05K 2201/0281* (2013.01); *H05K 2201/10378* (2013.01); *H05K 2201/10636* (2013.01); *H05K 2201/10962* (2013.01); *Y02P 70/611* (2015.11); *Y02P 70/613* (2015.11)

(58) Field of Classification Search
CPC ....................................................... H01G 4/248
USPC ........................................................ 174/260
See application file for complete search history.

(56) References Cited

U.S. PATENT DOCUMENTS

| | | | |
|---|---|---|---|
| 6,509,634 B1 | 1/2003 | Lee et al. | |
| 2005/0136326 A1* | 6/2005 | Aisenbrey | B29C 45/0001 429/178 |
| 2006/0199405 A1* | 9/2006 | Sato | G01R 1/0735 439/91 |
| 2013/0020913 A1 | 1/2013 | Shirakawa et al. | |
| 2016/0007446 A1* | 1/2016 | Ishikawa | H05K 1/113 174/260 |

FOREIGN PATENT DOCUMENTS

| | | |
|---|---|---|
| JP | 2013-26392 A | 2/2013 |
| KR | 10-2001-0028498 A | 4/2001 |
| KR | 10-2005-0093878 A | 9/2005 |

* cited by examiner

*Primary Examiner* — Hoa C Nguyen
*Assistant Examiner* — Stanley Tso
(74) *Attorney, Agent, or Firm* — McDermott Will & Emery LLP

(57) ABSTRACT

A capacitor component includes a capacitor body including dielectric layers and first and second internal electrodes alternately stacked; and a connection terminal coupled to the capacitor body and including a buffer member having insulating properties and at least one conductive fiber portion penetrating through the buffer member.

14 Claims, 7 Drawing Sheets

CAPACITOR COMPONENT AND BOARD HAVING THE SAME

CROSS-REFERENCE TO RELATED APPLICATIONS

This application claims the benefit of priority to Korean Patent Application No. 10-2015-0129489, filed on Sep. 14, 2015 with the Korean Intellectual Property Office, the entirety of which is incorporated herein by reference.

TECHNICAL FIELD

The present disclosure relates to a capacitor component and a board having the same.

BACKGROUND

Examples of electronic components using a ceramic material include capacitors, inductors, piezoelectric elements, varistors, thermistors, and the like.

Among ceramic electronic components, multilayer ceramic capacitors (MLCC) may be used in various electronic devices, due to advantages thereof such as a compact size, high capacitance, ease of mounting, and the like.

For example, a multilayer ceramic capacitor may be used in a chip type condenser mounted on a printed circuit board of various types of electronic products such as imaging devices, liquid crystal displays (LCDs) or plasma display panels (PDPs), computers, personal digital assistants (PDAs), and mobile phones, serving to charge or discharge electricity therein or therefrom.

Such a multilayer ceramic capacitor may have a structure in which a plurality of dielectric layers and internal electrodes having different polarities are stacked alternatingly.

In this case, since the dielectric layers may have piezoelectric properties, when a direct current (DC) or alternating current (AC) voltage is applied to the multilayer ceramic capacitor, a piezoelectric phenomenon may be generated in the dielectric layers interposed between the internal electrodes, thereby causing periodic vibrations due to a volume of a capacitor body expanding and contracting according to a frequency of the voltage.

These vibrations may be transferred to a printed circuit board through external electrodes of the multilayer ceramic capacitor and a soldering material connecting the external electrodes to the printed circuit board. The entire printed circuit board may act as an acoustic reflective surface to generate a vibration sound, which the user experiences as noise. This vibrated sound may have a frequency corresponding to an audio frequency in a region of 20 to 20,000 Hz, which may cause listener discomfort and is referred to as acoustic noise.

Furthermore, in recent electronic devices, since attempts to reduce noise of equipment components have been ongoing, acoustic noise generated in multilayer ceramic capacitors as described above may become more noticeable.

When the operating environments of equipment are relatively silent, users may regard such acoustic noise as abnormal sound, and thus may mistakenly believe the noise of acoustic noises to signal the breakdown of equipment. In addition, in devices having voice circuits, acoustic noise may overlap with audio output, thereby leading to deterioration in the quality of the devices.

SUMMARY

An aspect of the present inventive concept provides a capacitor component allowing for a significant decrease in acoustic noise, and a board having the same.

According to an aspect of the present inventive concept, a capacitor component includes a buffer member having insulating properties and at least one conductive fiber portion penetrating through the buffer member, allowing for a reduction in acoustic noise.

According to another aspect of the present inventive concept, a board includes the capacitor component.

BRIEF DESCRIPTION OF THE DRAWINGS

The above and other aspects, features and other advantages of the present inventive concept will be more clearly understood from the following detailed description taken in conjunction with the accompanying drawings, in which.

DETAILED DESCRIPTION

Figure 1:
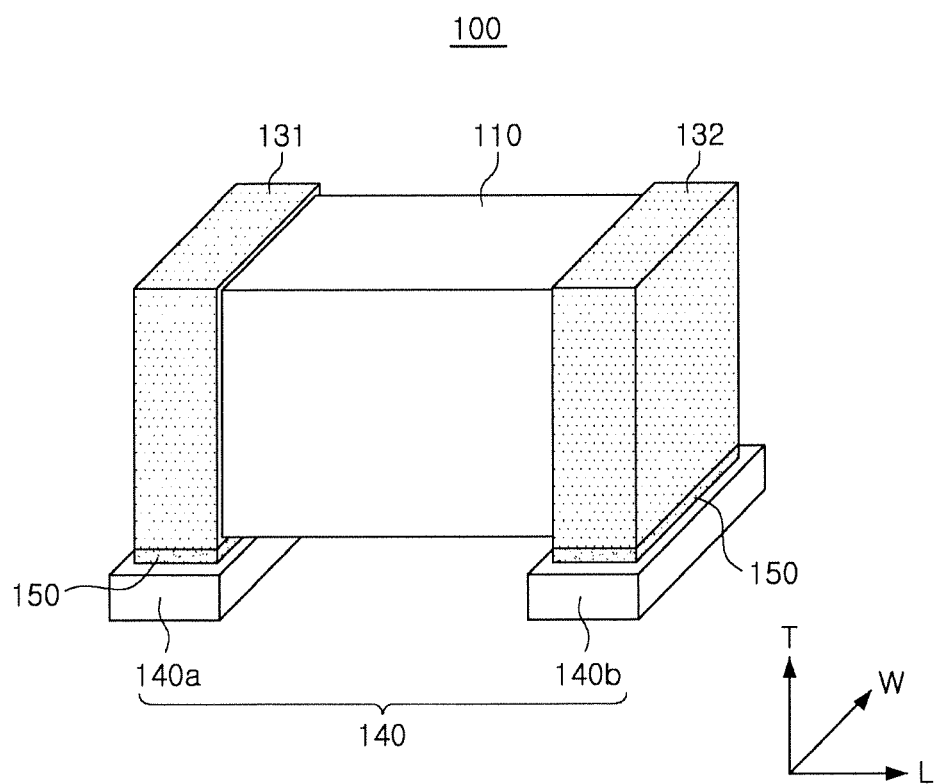
FIG. 1 is a perspective view of a capacitor component according to an exemplary embodiment.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relative relationship to one or more other element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the devices in the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups, but do not preclude the presence or addition of one or more other features, integers, steps, operations, members, elements, and/or groups.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Directions of a hexahedron will be defined in order to clearly describe exemplary embodiments of the present inventive concept. L, W and T directions shown in FIG. 1 refer to a length direction, a width direction, and a thickness direction, respectively.

Hereinafter, a capacitor component 100 according to an exemplary embodiment of the present inventive concept will be described in detail.

Figure 2:
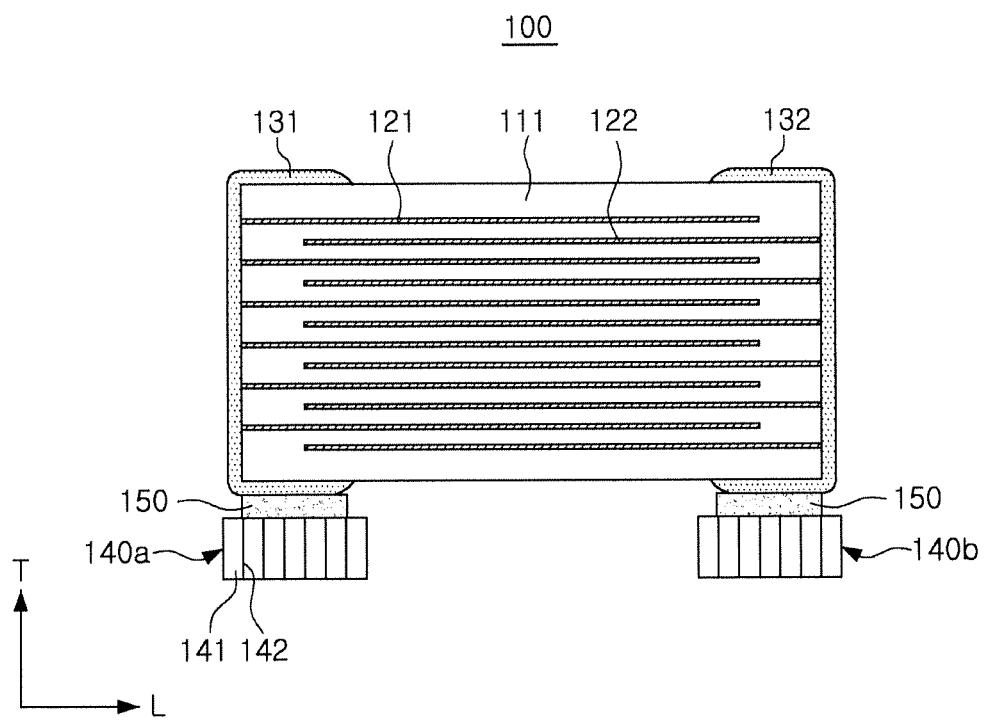
FIG. 2 is a cross-sectional view of the capacitor component according to an exemplary embodiment.

FIG. 1 is a perspective view of a capacitor component 100 according to an exemplary embodiment of the present inventive concept. FIG. 2 is a cross-sectional view of the capacitor component 100 according to the exemplary embodiment.

A capacitor body 110 may include a plurality of dielectric layers 111 and first and second internal electrodes 121 and 122 formed on the respective dielectric layers 111, and may be formed by stacking the plurality of dielectric layers on which the internal electrodes are formed. In addition, the first and second internal electrodes 121 and 122 may be disposed to face each other with respective dielectric layers interposed therebetween.

A shape of the capacitor body 110 is not particularly limited, but may be hexahedral. Due to the sintering shrinkage of a dielectric powder at the time of sintering a chip, the capacitor body 110 may not have a perfect hexahedral shape and may have a substantially hexahedral shape. The plurality of dielectric layers 111 configuring the capacitor body 110 may be in a sintered state, and boundaries between the dielectric layers 111 adjacent to each other may be integrated such that they may not be readily discernible with the naked eye.

The dielectric layers 111 may contain a ceramic material having a high dielectric constant. The ceramic material may include, for example, a $BaTiO_3$ (barium titanate)-based ceramic powder or the like, but the present inventive concept is not limited thereto. An example of the $BaTiO_3$ based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca (calcium), Zr (zirconium) or the like, is partially dissolved in $BaTiO_3$, but the present inventive concept is not limited thereto.

A connection terminal 140 may be disposed to be coupled to the capacitor body 110, and may include a buffer member 141 having insulating properties and at least one conductive fiber portion 142 penetrating through the buffer member 141.

A shape of the connection terminal 140 may be variously modified and may be formed on the entirety of one surface of the capacitor body 110. When the connection terminal 140 is only formed on a portion of one surface of the capacitor body 110, however, efficiency in noise reduction may be further increased. For example, the connection terminal 140 may be only formed on both end portions of one surface of the capacitor body 110. In this case, the connection terminal 140 may include first and second connection terminals 140a and 140b connected to the first and second internal electrodes 121 and 122, respectively.

The buffer member 141 may serve as a buffer capable of being elastically deformed when external force is applied thereto to reduce acoustic noise due to piezoelectric properties of a capacitor. That is, noise occurring in the capacitor may be blocked or alleviated by the buffer member, whereby adverse effects influencing a base substrate and the like may be effectively reduced. Examples of a material of the buffer member functioning as a buffer while having insulating properties may include rubber, an insulating resin, and the like.

The conductive fiber portion 142 may serve to electrically connect capacitor elements and the like, disposed above and below the connection terminal 140, or as described later, may serve as a plating seed to promote bonding between the capacitor body 110 and the connection terminal 140 by soldering, thereby improving adhesive strength between the capacitor body 110 and the connection terminal 140. The conductive fiber portion 142 may be formed of a metallic material having excellent electrical conductivity, for example, copper (Cu), silver (Ag), gold (Au) or the like.

Figure 3A:
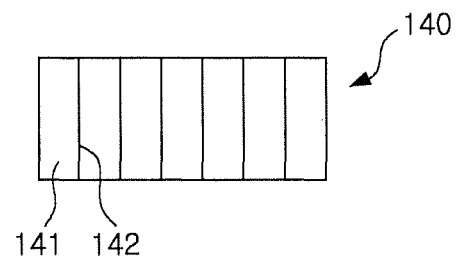
FIGS. 3A through 3C are cross-sectional views of the connection terminal of a capacitor component according to various exemplary embodiments.
Figure 3B:
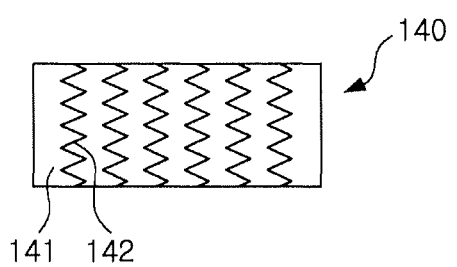
Figure 3C:
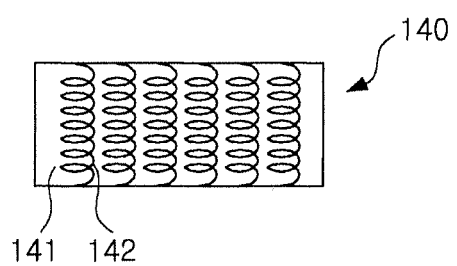

FIG. 3A through FIG. 3C are cross-sectional views of the connection terminal 140 of the capacitor component 100 according to various exemplary embodiments of the present inventive concept. Referring to FIG. 3A through FIG. 3C, the conductive fiber portion 142 may have, for example, a linear shape, may be bent multiple times, or may have a spiral shape, but is not limited thereto.

As an element for mechanically or electrically coupling the capacitor body 110 and the connection terminal 140, a conductive adhesive 150 may be provided between the capacitor body 110 and the connection terminal 140. Any material capable of implementing such coupling may be used. For example, cured conductive paste or conductive resin paste may be used. The conductive adhesive is not an essential component in the present inventive concept, however, and in some cases, the capacitor body 110 and the connection terminal 140 may be directly bonded to each other.

According to an exemplary embodiment of the present inventive concept, the capacitor component 100 may further include first and second external electrodes 131 and 132 formed on external portions of the capacitor body 110 and electrically connected to the first and second internal electrodes 121 and 122, respectively. In this case, the first and second connection terminals 140a and 140b may be electrically connected to the first and second internal electrodes 121 and 122, respectively, through the first and second external electrodes 131 and 132.

Figure 4:
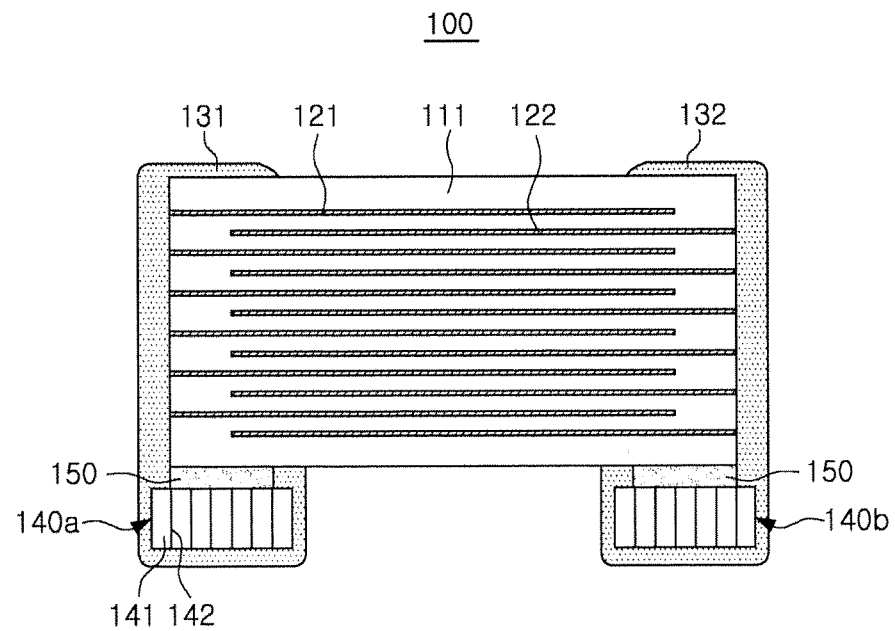
FIG. 4 is a cross-sectional view of the capacitor component according to an example modified from an exemplary embodiment.

FIG. 4 is a cross-sectional view of the capacitor component according to an example modified from an exemplary embodiment of the present inventive concept.

According to an example modified from an exemplary embodiment of the present inventive concept, the first and second external electrodes 131 and 132 may entirely cover the first and second connection terminals 140a and 140b. In addition, first and second plating electrodes 133 and 134 (not shown) may be formed on surfaces of the first and second external electrodes 131 and 132. In this case, adhesive strength between the capacitor body 110 and the connection terminal 140 may be further improved.

Figure 5:
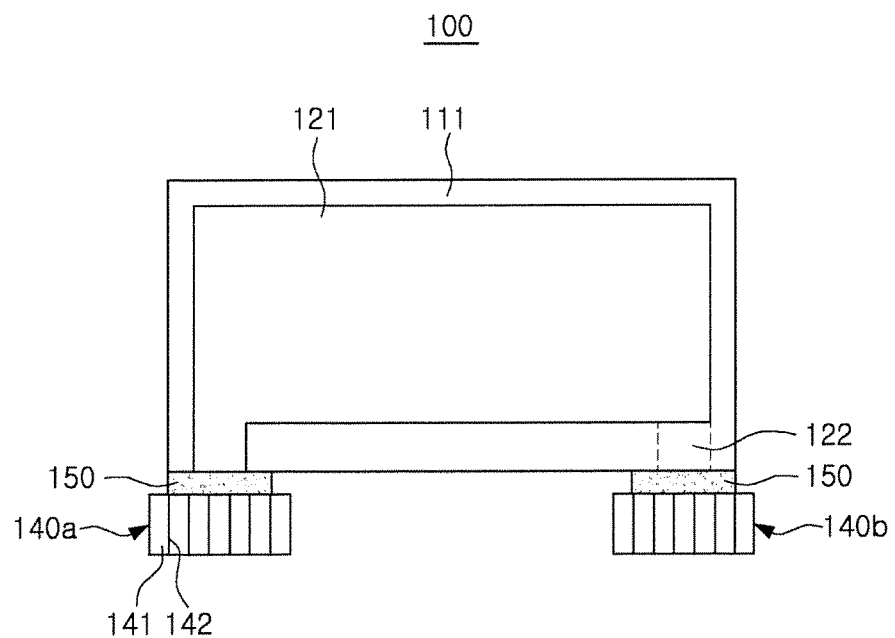
FIG. 5 is a cross-sectional view of a capacitor component according to another exemplary embodiment.

FIG. 5 is a cross-sectional view of a capacitor component according to another exemplary embodiment of the present inventive concept. The embodiment of FIG. 5 is different from the foregoing embodiments in terms of a form of the capacitor. First, the capacitor component 100 according to the exemplary embodiment of FIG. 5 is different from the embodiments of FIGS. 2 and 4 in terms of the manner in which the internal electrodes 121 and 122 are disposed. Specifically, the capacitor body 110 may include the internal electrodes 121 and 122 disposed in a perpendicular mounting manner. That is, in the exemplary embodiment of FIG. 5, the plurality of internal electrodes 121 and 122 may be disposed perpendicularly with respect to a mounting surface, unlike the embodiments of FIGS. 2 and 4 in which the plurality of internal electrodes 121 and 122 are disposed to be parallel with respect to a mounting surface.

According to another exemplary embodiment of the present inventive concept, the first and second connection terminals 140a and 140b are provided while being directly connected to the first and second internal electrodes 121 and 122. In this case, the external electrodes 131 and 132 may be omitted and thus, the volume of the capacitor body may be optimized.

Hereinafter, a capacitor-mounting board 200 according to an exemplary embodiment of the present inventive concept will be described. In contents regarding the capacitor-mounting board, a description overlapped with that of the aforementioned capacitor component will be omitted herein in order to avoid repeated explanation.

Figure 6:
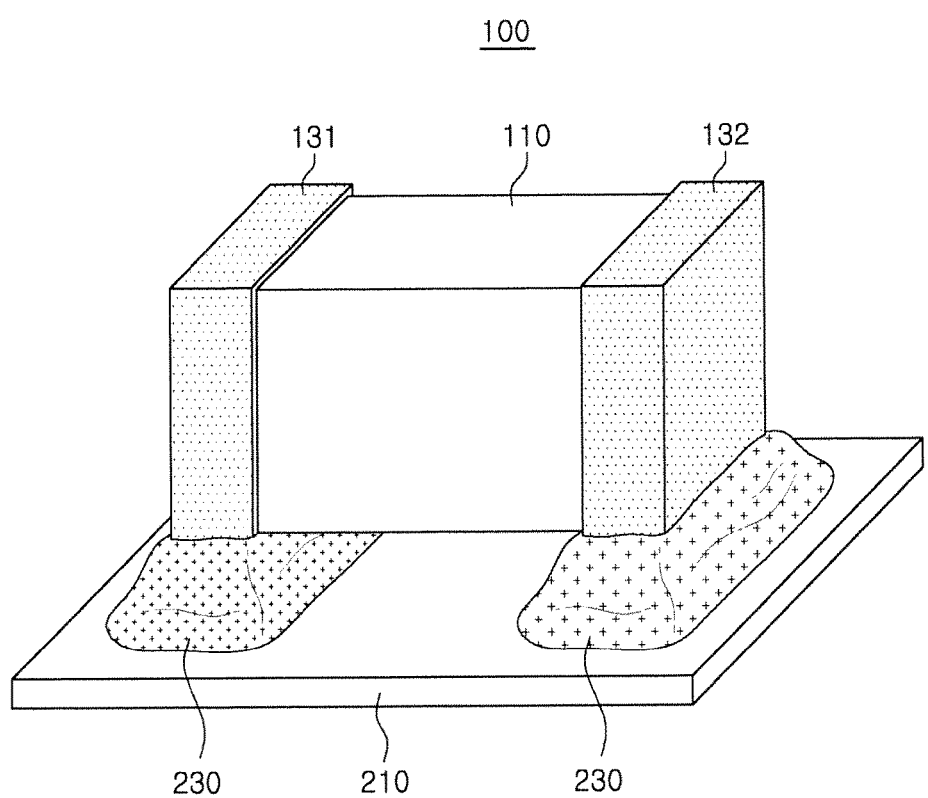
FIG. 6 is a perspective view illustrating a capacitor-mounting board according to an exemplary embodiment.

FIG. 6 is a perspective view illustrating a capacitor-mounting board according to an exemplary embodiment of the present inventive concept.

The capacitor-mounting board 200 according to an exemplary embodiment of the present inventive concept may include a base substrate 210, the capacitor body 110 mounted on the base substrate 210 and having a structure in which the dielectric layers 111 and the first and second internal electrodes 121 and 122 are stacked alternatingly, and the connection terminal 140 disposed between the base substrate 210 and the capacitor body 110 to be coupled to the capacitor body 110 and including the buffer member 141 having insulating properties and at least one conductive fiber portion 142 penetrating through the buffer member 141.

The base substrate 210, a circuit board provided with one or more layers of circuits including a connection pad on an insulating layer, may be a printed circuit board.

At least one or more connection pads 221 and 222 may be formed on one surface of the base substrate 210 in order to facilitate electrical connection between the capacitor body 110 and the base substrate 210.

The capacitor component 100 may be mounted in a state in which the first and second connection terminals 140a and 140b are positioned on the connection pads 221 and 222 to be in contact therewith, the first and second connection terminals 140a and 140b being disposed on an upper surface of the base substrate 210 to be spaced apart from each other, and may be electrically connected to the base substrate 210 by soldering portions 230.

Figure 7A:
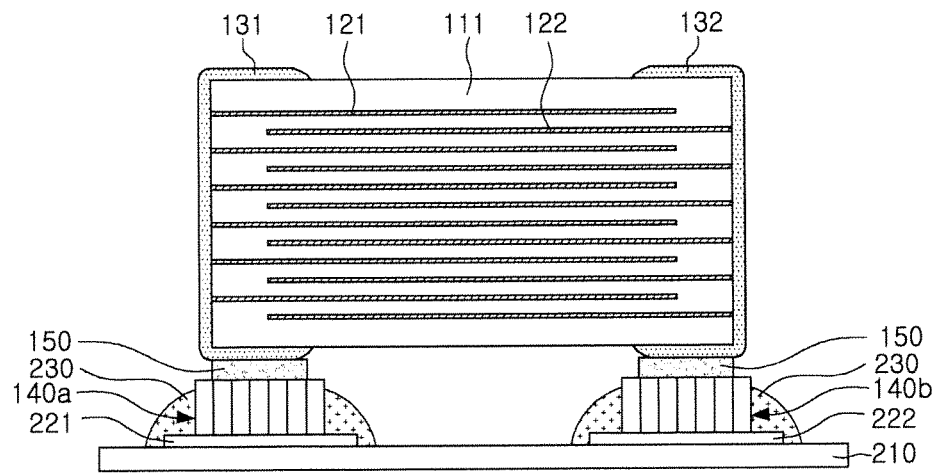
FIG. 7A through 7C are cross-sectional views illustrating capacitor-mounting boards according to various exemplary embodiments, in which a conductive fiber portion is shown.
Figure 7B:
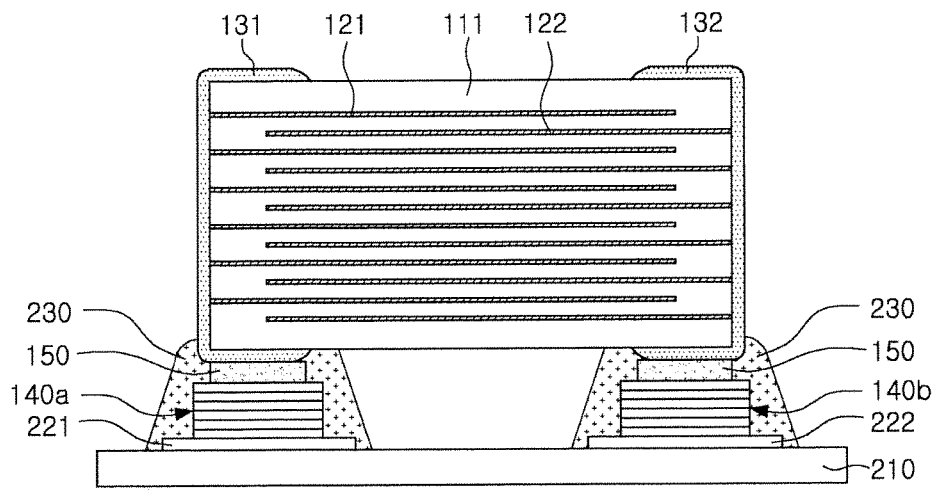
Figure 7C:
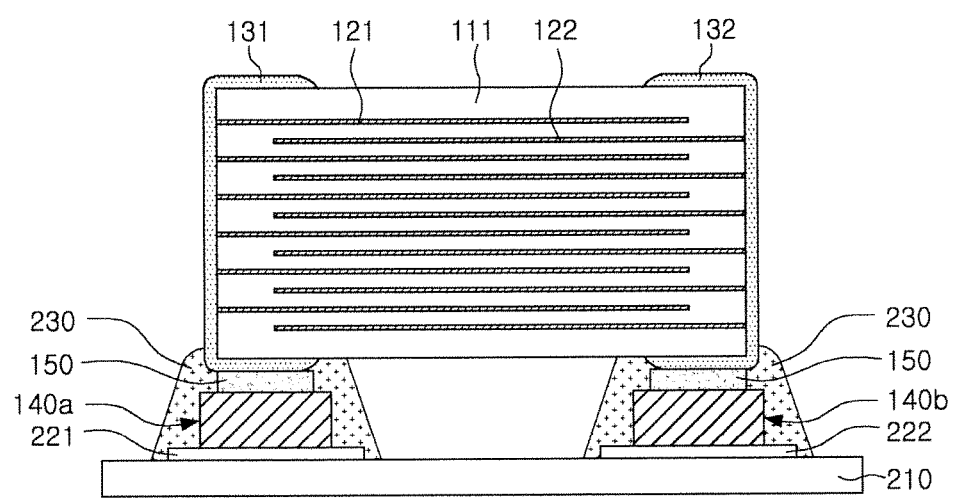

FIG. 7A through FIG. 7C are cross-sectional views illustrating capacitor-mounting boards according to various exemplary embodiments of the present inventive concept, in which a conductive fiber portion is shown.

According to the exemplary embodiment of FIG. 7A, the conductive fiber portion may be formed to penetrate through the buffer member in a direction perpendicular to the mounting surface, and in this case, the conductive fiber portion may serve to electrically connect the capacitor body and the base substrate to each other, such that the capacitor component may be stably mounted without a solder fillet.

According to the exemplary embodiment, the connection terminal and the base substrate may be bonded to each other by the soldering portions. In this case, since a height of the soldering portions may not be significantly high, due to the absence of a plating seed on a surface of the connection terminal, a soldering portion may not reach the capacitor body and accordingly, efficiency in noise reduction may be further increased.

According to the exemplary embodiment of FIG. 7B, the conductive fiber portion may be formed to penetrate through the buffer member in a direction parallel to the mounting surface, and in this case, the conductive fiber portion may serve as a plating seed during soldering and a soldering portion may reach the capacitor body, whereby adhesive strength between the capacitor body and the connection terminal may be improved.

According to the exemplary embodiment of FIG. 7C, the conductive fiber portion may be formed to penetrate through the buffer member while having a predetermined angle (greater than 0° and less than 90°) with respect to the mounting surface. In this case, the conductive fiber portion may serve to electrically connect the capacitor body and the base substrate to each other, as well as improving adhesive strength between the capacitor body and the base substrate.

As set forth above, the capacitor-mounting board according to an exemplary embodiment of the present inventive concept may have advantages such as a significant decrease in acoustic noise.

The capacitor-mounting board according to an exemplary embodiment of the present inventive concept may be advantageous in that it may be stably mounted without a solder fillet and thus, a mounting area may be reduced.

While exemplary embodiments have been shown and described above, it will be apparent to those skilled in the art that modifications and variations could be made without departing from the scope of the invention as defined by the appended claims.

What is claimed is:

1. A capacitor component comprising:

a capacitor body including dielectric layers and first and second internal electrodes alternately stacked; and a connection terminal coupled to the capacitor body and including a buffer member having insulating properties and at least one conductive fiber portion penetrating through the buffer member, wherein the connection terminal includes first and second connection terminals disposed on opposite ends of the capacitor body, and wherein the first and second connection terminals each have a hexahedral shape including first and second surfaces parallel to a mounting surface, and side surfaces perpendicular to the first and second surfaces, the first and second connection terminals are only connected to each other via the first and second surfaces, and are not connected to each other via any of the side surfaces, the conductive fiber portion has a spiral shape, and the conductive fiber portion penetrates through the buffer member at an angle of greater than 0° and less than 90° with respect to a mounting surface.

2. The capacitor component of claim 1, wherein the connection terminal includes first and second connection terminals connected to the first and second internal electrodes, respectively.

3. The capacitor component of claim 1, further comprising: a conductive adhesive disposed between the capacitor body and the connection terminal.

4. The capacitor component of claim 1, further comprising: first and second external electrodes formed on external portions of the capacitor body and electrically connected to the first and second internal electrodes, respectively.

5. The capacitor component of claim 4, wherein the first and second external electrodes cover an entirety of the first and second connection terminals, respectively.

6. The capacitor component of claim 4, further comprising: first and second plating electrodes formed on surfaces of the first and second external electrodes, respectively.

7. The capacitor component of claim 1, wherein the connection terminal includes rubber or an insulating resin.

8. A capacitor-mounting board, comprising:

a base substrate;

a capacitor body mounted on the base substrate and including dielectric layers and first and second internal electrodes alternately stacked; and, a connection terminal disposed between the base substrate and the capacitor body to be coupled to the capacitor body and including a buffer member having insulating properties and at least one conductive fiber portion penetrating through the buffer member, wherein the connection terminal includes first and second connection terminals disposed on opposite ends of the capacitor body, and wherein the first and second connection terminals each have a hexahedral shape including first and second surfaces parallel to a mounting surface, and side surfaces perpendicular to the first and second surfaces, the first and second connection terminals are only connected to each other via the first and second surfaces, and are not connected to each other via any of the side surfaces, the conductive fiber portion has a spiral shape, and the conductive fiber portion penetrates through the buffer member at an angle of greater than 0° and less than 90° with respect to a mounting surface.

9. The capacitor-mounting board of claim 8, wherein the connection terminal includes first and second connection terminals connected to the first and second internal electrodes, respectively.

10. The capacitor-mounting board of claim 8, further comprising: a conductive adhesive disposed between the capacitor body and the connection terminal.

11. The capacitor-mounting board of claim 8, further comprising: first and second external electrodes formed on external portions of the capacitor body and electrically connected to the first and second internal electrodes, respectively.

12. The capacitor-mounting board of claim 11, wherein the first and second external electrodes cover an entirety of the first and second connection terminals, respectively.

13. The capacitor-mounting board of claim 11, further comprising: first and second plating electrodes formed on surfaces of the first and second external electrodes, respectively.

14. The capacitor-mounting board of claim 8, wherein the connection terminal and the base substrate are bonded to each other by soldering.

* * * * *